US010559745B2

(12) United States Patent
Hong et al.

(10) Patent No.: US 10,559,745 B2
(45) Date of Patent: Feb. 11, 2020

(54) MAGNETIC TUNNEL JUNCTION (MTJ) STRUCTURE WITH PERPENDICULAR MAGNETIC ANISOTROPY (PMA) HAVING AN OXIDE-BASED PMA-INDUCING LAYER AND MAGNETIC ELEMENT INCLUDING THE SAME

(71) Applicant: Industry-University Cooperation Foundation Hanyang University, Seoul (KR)

(72) Inventors: Jinpyo Hong, Seoul (KR); Gwangguk An, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 16/087,445

(22) PCT Filed: Mar. 22, 2017

(86) PCT No.: PCT/KR2017/003083
§ 371 (c)(1),
(2) Date: Sep. 21, 2018

(87) PCT Pub. No.: WO2017/164646
PCT Pub. Date: Sep. 28, 2017

(65) Prior Publication Data
US 2019/0044056 A1    Feb. 7, 2019

(30) Foreign Application Priority Data
Mar. 24, 2016  (KR) .......................... 10-2016-0034983

(51) Int. Cl.
*H01L 43/02*    (2006.01)
*H01L 43/10*    (2006.01)
(Continued)

(52) U.S. Cl.
CPC ............ *H01L 43/02* (2013.01); *G11C 11/161* (2013.01); *H01L 43/08* (2013.01); *H01L 43/10* (2013.01); *H01L 43/12* (2013.01); *H01L 27/222* (2013.01)

(58) Field of Classification Search
CPC ......... H01L 43/02; H01L 43/08; H01L 43/10; H01L 43/12; G11C 11/161; H01F 10/324–3295
See application file for complete search history.

(56) References Cited

U.S. PATENT DOCUMENTS 9,202,545 B2 * 12/2015 Sato .................. H01L 43/08
9,337,415 B1 *  5/2016 Oh ..................... H01L 43/08
(Continued)

FOREIGN PATENT DOCUMENTS

JP    2013-197518 A    9/2013
JP    2016-015490 A    1/2016
(Continued)

OTHER PUBLICATIONS

International Search Report for PCT/KR2017/003083 dated Jun. 23, 2017 [PCT/ISA/210].

*Primary Examiner* — Younes Boulghassoul
(74) *Attorney, Agent, or Firm* — Sughrue Mion, PLLC (57) ABSTRACT

Disclosed herein are a magnetic tunnel junction (MTJ) structure with perpendicular magnetic anisotropy (PMA) and a magnetic element including the same. The MTJ structure with PMA includes a substrate, a perpendicular magnetic anisotropic inducing layer configured to be disposed on the substrate and including an oxide-based material, a perpendicular antiferromagnetic layer configured to be disposed on the perpendicular magnetic anisotropic inducing layer and including an antiferromagnetic material, a first ferromagnetic layer configured to be disposed on the perpendicular antiferromagnetic layer and having PMA, a
(Continued)

tunneling barrier layer configured to be disposed on the first ferromagnetic layer, and a second ferromagnetic layer configured to be disposed on the tunneling barrier layer and having PMA. Therefore, the perpendicular antiferromagnetic layer generates perpendicular coupling at an interface with the perpendicular magnetic anisotropic inducing layer such that perpendicular coupling is further generated between the perpendicular antiferromagnetic layer and the first ferromagnetic layer.

15 Claims, 3 Drawing Sheets

(51) Int. Cl.
*H01L 43/08* (2006.01)
*G11C 11/16* (2006.01)
*H01L 27/22* (2006.01)
*H01L 43/12* (2006.01)

(56) References Cited

U.S. PATENT DOCUMENTS

| | | | | |
|---|---|---|---|---|
| 9,450,177 B2* | 9/2016 | Ohno | | H01L 43/08 |
| 9,853,206 B2* | 12/2017 | Pinarbasi | | H01L 43/08 |
| 2010/0080050 A1* | 4/2010 | Ozeki | | B82Y 25/00 |
| | | | | 365/158 |
| 2010/0096716 A1* | 4/2010 | Ranjan | | B82Y 10/00 |
| | | | | 257/421 |
| 2011/0303996 A1* | 12/2011 | Kim | | B82Y 25/00 |
| | | | | 257/421 |
| 2012/0146167 A1* | 6/2012 | Huai | | G11C 11/161 |
| | | | | 257/421 |
| 2012/0261777 A1* | 10/2012 | Shukh | | H01L 43/08 |
| | | | | 257/421 |
| 2012/0267733 A1* | 10/2012 | Hu | | H01L 43/08 |
| | | | | 257/421 |
| 2012/0292724 A1* | 11/2012 | Lim | | H01L 43/08 |
| | | | | 257/421 |
| 2013/0032910 A1* | 2/2013 | Jung | | H01L 43/08 |
| | | | | 257/421 |
| 2014/0175582 A1* | 6/2014 | Apalkov | | H01L 43/08 |
| | | | | 257/425 |
| 2014/0340961 A1* | 11/2014 | Ohno | | H01L 43/08 |
| | | | | 365/158 |
| 2015/0162525 A1* | 6/2015 | Park | | H01L 43/10 |
| | | | | 257/421 |
| 2018/0013059 A1* | 1/2018 | Hong | | H01L 43/02 |
| 2018/0026178 A1* | 1/2018 | Tran | | H01L 43/08 |
| | | | | 257/421 |
| 2018/0248115 A1* | 8/2018 | Oguz | | H01F 10/30 |

FOREIGN PATENT DOCUMENTS

| | | |
|---|---|---|
| KR | 10-2009-0084564 A | 8/2009 |
| KR | 10-2014-0099886 A | 8/2014 |
| KR | 10-2015-0015927 A | 2/2015 |

* cited by examiner

MAGNETIC TUNNEL JUNCTION (MTJ) STRUCTURE WITH PERPENDICULAR MAGNETIC ANISOTROPY (PMA) HAVING AN OXIDE-BASED PMA-INDUCING LAYER AND MAGNETIC ELEMENT INCLUDING THE SAME

CROSS REFERENCE TO RELATED APPLICATIONS

This application is a National Stage of International Application No. PCT/KR2017/003083, filed on Mar. 22, 2017, which claims priority from Korean Patent Application No. 10-2016-0034983, filed on Mar. 24, 2016.

BACKGROUND

1. Technical Field

Example embodiments of the present invention relate to a magnetic tunnel junction (MTJ) structure with perpendicular magnetic anisotropy (PMA), and more specifically to an MTJ structure with PMA which is capable of securing a coercive force of a fixed layer, and a magnetic element including the same.

2. Related Art

Ferroelectric random access memories (FeRAMs), magnetic RAMs (MRAMs), resistive RAMs (ReRAMs), phase-change RAMs (PRAMs), and the like are examples of next generation nonvolatile memories which have been attracting attention as a demand for a new information storage medium. These memories have specific merits, and research and development are being actively conducted in a direction suited to their use.

Among such memories, the MRAM is a memory device using a quantum mechanical effect called magnetoresistance and is a memory device for large capacity, which is capable of storing non-volatile data in features of high density and high response with low power consumption and replacing a dynamic RAM (DRAM) which is a memory device being currently widely used.

As the magnetoresistive effect, a giant magnetoresistive (GMR) effect and a tunneling magnetoresistive (TMR) effect are known.

An element using the GMR effect stores information using a phenomenon in which resistance of a conductor disposed between two ferromagnetic layers, which are vertically disposed, is varied according to spin directions of the two ferromagnetic layers. However, since a magnetoresistance (MR) ratio of the GMR element, which represents a ratio in variation of a magnetoresistance value, is as low as 10%, a read signal of the stored information is low and thus securing a read margin is the biggest challenge in realizing MRAM.

Meanwhile, as a typical device utilizing the TMR effect, a magnetic tunnel junction (MTJ) element using a variation in magnetoresistance due to an effect of magnetic tunnel junction is known.

The MTJ element has a stacked structure of ferromagnetic layer/insulating layer/ferromagnetic layer. In the MTJ element, when upper and lower ferromagnetic layers have the same spin direction, a tunnel probability between the upper and lower ferromagnetic layers, between which a tunnel insulating film is interposed, is maximized such that a resistance value is minimized. In contrast, when the spin directions are opposite, the tunnel probability is minimized such that the resistance value is maximized.

In order to realize the above-described two spin states, one of the upper and lower ferromagnetic layers (magnetic film) is set such that a magnetization direction is fixed and is not influenced by external magnetization. Generally, one of the upper and lower ferromagnetic layers having a fixed magnetization direction is referred to as a fixed layer or a pinned layer.

A magnetization direction of the other ferromagnetic layer (magnetic film) may have the same magnetization direction as or an opposite magnetization direction of the fixed layer according to a direction of an applied magnetic field. In this case, the other ferromagnetic layer is generally called a free layer and is responsible for storing information.

In the case of the MTJ element, it has been recognized that an MR ratio, as a resistance rate, is exceeding 50% and is becoming the mainstream of MRAM development.

Meanwhile, among these MTJ elements, the MTJ elements using perpendicular magnetic anisotropy (PMA) materials are attracting attention.

Particularly, studies for applying the MTJ element using the PMA material to a perpendicular spin transfer torque (STT) MRAM (STT-MRAM) have been actively conducted.

An STT recording method refers to a method of inducing magnetic switching by directly injecting a current into a magnetic tunnel junction instead of an external magnetic field. The STT recording method is advantageous for high integration because there is no need for a separate external conducting wire.

Meanwhile, in order to apply an MTJ structure to the STT-MRAM, a sufficient coercive force of a fixed layer should be secured. In the case of a conventional MTJ using horizontal magnetic anisotropy, as a method of sufficiently securing a coercive force, a coercive force of a fixed layer is secured using interaction at a junction between an antiferromagnetic material and a magnetic material.

However, in the MTJ using PMA, there has not yet been found an antiferromagnetic material capable of causing perpendicular coupling. Therefore there have been attempts to secure a sufficient coercive force of a fixed layer using perpendicular coupling between synthetic ferromagnetic layers, but there are still many difficulties.

That is, a synthetic antiferromagnetic layer for perpendicular coupling is formed by inserting a spacer layer (space layer) such as Ru or the like between two Co/Pd or Co/Pt multilayered structures exhibiting strong perpendicular magnetic properties. Therefore, a synthetic antiferromagnetic coupling structure is complicated to manufacture and has problems such as heat treatment stability and the like inherent in the Co/Pd or Co/Pd multilayered structure.

(Patent Document) Korean Patent Laid-Open Application No. 10-2009-0060063

SUMMARY

Accordingly, example embodiments of the present invention are provided to substantially obviate one or more problems due to limitations and disadvantages of the related art.

Example embodiments of the present invention provide a magnetic tunnel junction (MTJ) structure with perpendicular magnetic anisotropy (PMA), which is capable of securing a coercive force of a fixed layer, and a magnetic element including the same.

Example embodiments of the present invention also provide an MTJ structure with PMA. In some example embodiments, the MTJ structure with PMA includes a substrate, a perpendicular magnetic anisotropic inducing layer configured to be disposed on the substrate and including an oxide-based material, a perpendicular antiferromagnetic layer configured to be disposed on the perpendicular magnetic anisotropic inducing layer and including an antiferromagnetic material, a first ferromagnetic layer configured to be disposed on the perpendicular antiferromagnetic layer and having PMA, a tunneling barrier layer configured to be disposed on the first ferromagnetic layer, and a second ferromagnetic layer configured to be disposed on the tunneling barrier layer and having PMA, wherein the perpendicular antiferromagnetic layer generates perpendicular coupling at an interface with the perpendicular magnetic anisotropic inducing layer such that perpendicular coupling is further generated between the perpendicular antiferromagnetic layer and the first ferromagnetic layer.

The oxide-based material may include a metal oxide.

The metal oxide may include a cobalt oxide, a nickel oxide, or an iron oxide.

The antiferromagnetic material may be an alloy including any one selected from the group consisting of Fe, Co, and Mn.

The first ferromagnetic layer may include at least one selected from the group consisting of Fe, Co, Ni, B, Si, Zr, Pt, Tb, Pd, Cu, W, Ta, and a mixture thereof.

The first ferromagnetic layer may secure a coercive force by perpendicular coupling with the perpendicular antiferromagnetic layer.

The MTJ structure may further include a spacer layer configured to be disposed between the perpendicular antiferromagnetic layer and the first ferromagnetic layer and including a non-magnetic metal.

The MTJ structure may further include an adjacent ferromagnetic layer configured to be disposed between the perpendicular antiferromagnetic layer and the spacer layer, and including a ferromagnetic material.

Example embodiments of the present invention further provide a magnetic tunnel junction (MTJ) structure with perpendicular magnetic anisotropy (PMA). In other example embodiments, the MTJ structure with PMA includes a substrate, a first ferromagnetic layer configured to be disposed on the substrate and having PMA, a tunneling barrier layer configured to be disposed on the first ferromagnetic layer, a second ferromagnetic layer configured to be disposed on the tunneling barrier layer and having PMA, a perpendicular antiferromagnetic layer configured to be disposed on the second ferromagnetic layer and including an antiferromagnetic material, and a perpendicular magnetic anisotropic inducing layer configured to be disposed on the perpendicular antiferromagnetic layer and including an oxide-based material, wherein the perpendicular antiferromagnetic layer generates perpendicular coupling at an interface with the perpendicular magnetic anisotropic inducing layer such that perpendicular coupling is further generated between the perpendicular antiferromagnetic layer and the second ferromagnetic layer.

The antiferromagnetic material may be an alloy including any one selected from the group consisting of Fe, Co, and Mn.

The second ferromagnetic layer may include at least one selected from the group consisting of Fe, Co, Ni, B, Si, Zr, Pt, Tb, Pd, Cu, W, Ta, and a mixture thereof.

The second ferromagnetic layer may secure a coercive force by perpendicular coupling with the perpendicular antiferromagnetic layer.

The MTJ structure may further include a spacer layer configured to be disposed between the second ferromagnetic layer and the perpendicular antiferromagnetic layer, and including a non-magnetic metal.

The MTJ structure may further include an adjacent ferromagnetic layer configured to be disposed between the spacer layer and the perpendicular antiferromagnetic layer and including a ferromagnetic material.

Example embodiments of the present invention further provide a magnetic element. In still other example embodiments, the magnetic element includes a plurality of digit lines, a plurality of bit lines across the tops of the plurality of digit lines, and the MTJ structure according to one of claims 1 to 14, which is interposed between the digit line and the bit line.

Formation of an synthetic antiferromagnetic layer for conventional perpendicular coupling is structurally more complex and difficult to fabricate. In addition, according to conventional art, this multi-layer structure increases the overall thickness of the device and is vulnerable to the heat treatment process, making it difficult to apply the MTJ.

According to the present invention, perpendicular coupling is generated at the perpendicular antiferromagnetic layer-ferromagnetic layer junction, which is structurally simple, lowers the overall thickness of the device, and is stable in the heat treatment process, which is a great leap for mass production of the MTJ element.

BRIEF DESCRIPTION OF DRAWINGS

Example embodiments of the present invention will become more apparent by describing in detail example embodiments of the present invention with reference to the accompanying drawings, in which.

DESCRIPTION OF EMBODIMENTS

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

While the present invention allows various modifications and alternatives, specific embodiments thereof are shown by way of examples in the drawings and will be described in detail below. However, the specific embodiments are not intended to limit the present invention, but the present invention includes all modifications, equivalents, and substitutions which are consistent with the spirit of the present invention defined by the appended claims.

When an element such as a layer, a region, or a substrate is referred to as being present "on" another element, it will be appreciated that the element is directly present on another other element or an intermediate element is present therebetween.

A magnetic tunnel junction (MTJ) element with perpendicular magnetic anisotropy (PMA) according to one embodiment of the present invention will be described.

Figure 1:
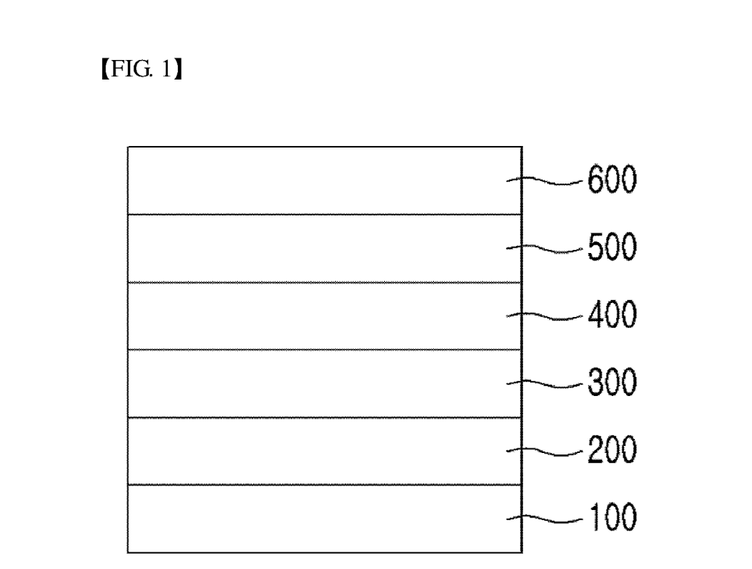
FIG. 1 is a cross-sectional view of a magnetic tunnel junction (MTJ) element with perpendicular magnetic anisotropy (PMA) according to one embodiment of the present invention.

FIG. 1 is a cross-sectional view of a magnetic tunnel junction (MTJ) element with perpendicular magnetic anisotropy (PMA) according to one embodiment of the present invention;

Referring to FIG. 1, the MTJ element with PMA according to one embodiment of the present invention may include a substrate 100, a perpendicular magnetic anisotropic inducing layer 200, a perpendicular antiferromagnetic layer 300, a first ferromagnetic layer 400, a tunneling barrier layer 500, and a second ferromagnetic layer 600.

The substrate 100 may employ a substrate made of various known materials. For example, the substrate 100 may be implemented with a silicon substrate. Alternatively, the substrate 100 may also be implemented with an electrode. In some cases, the substrate 100 may be omitted.

The perpendicular magnetic anisotropic inducing layer 200 is disposed on the substrate 100. The perpendicular magnetic anisotropic inducing layer 200 may contain an oxide-based material. The oxide-based material is a metal oxide. For example, the metal oxide may include a cobalt oxide, a nickel oxide, or an iron oxide. However, the present invention is not limited thereto.

The perpendicular magnetic anisotropic inducing layer 200 generates perpendicular coupling at an interface with the perpendicular antiferromagnetic layer 300 which will be described below.

The perpendicular magnetic anisotropic inducing layer 200 may be formed by conventional deposition. For example, physical vapor deposition (PVD), chemical vapor deposition (CVD), or sputtering is possible.

The perpendicular antiferromagnetic layer 300 is disposed on a perpendicular magnetic anisotropic inducing layer 200. At this point, the perpendicular antiferromagnetic layer 300 may contain an antiferromagnetic material. For example, the antiferromagnetic material may include any one selected from the group consisting of Fe, Co, and Mn. However, the present invention is not limited thereto, and the antiferromagnetic material may employ any known ferrimagnetic substance or antiferromagnetic material.

The antiferromagnetic material by itself does not induce perpendicular coupling with the first ferromagnetic layer 400.

Accordingly, in the present invention, the perpendicular magnetic anisotropic inducing layer 200 is disposed below the perpendicular antiferromagnetic layer 300. Therefore, the perpendicular antiferromagnetic layer 300 generates perpendicular coupling at an interface with the perpendicular magnetic anisotropic inducing layer 200 so that perpendicular coupling is generated between the perpendicular antiferromagnetic layer 300 and the first ferromagnetic layer 400, which is described below. The perpendicular coupling generated at the interface between the perpendicular antiferromagnetic layer 300 and the perpendicular magnetic anisotropic inducing layer 200 refers to an action in which perpendicular crystal orientation, which is caused by coupling between the magnetic material of the perpendicular antiferromagnetic layer 300 and oxygen of the perpendicular magnetic anisotropic inducing layer 200, induces PMA.

The perpendicular antiferromagnetic layer 300 may be formed by conventional deposition. For example, PVD, CVD, or sputtering is possible.

The first ferromagnetic layer 400 is disposed on the perpendicular antiferromagnetic layer 300. In this case, the first ferromagnetic layer 400 is typically made of a ferromagnetic material having PMA. For example, the first ferromagnetic layer 400 may include at least one selected from the group consisting of Fe, Co, Ni, B, Si, Zr, Pt, Tb, Pd, Cu, W, Ta, and a mixture thereof to have PMA. For example, the first ferromagnetic layer 400 may contain CoFeB. In this case, the first ferromagnetic layer 400 containing CoFeB may be formed with a thickness of 1.5 nm or less to have PMA.

The first ferromagnetic layer 400 may be formed by conventional deposition. For example, PVD, CVD, or sputtering is possible.

Meanwhile, the first ferromagnetic layer 400 may already have PMA upon being formed, but it may also have PMA subsequent to being formed through heat treatment or the like.

Further, a magnetization direction of the first ferromagnetic layer 400 is fixed by the perpendicular antiferromagnetic layer 300 to serve as a fixed layer.

Furthermore, the first ferromagnetic layer 400 may secure a sufficient coercive force by perpendicular coupling with the above-described perpendicular antiferromagnetic layer 300. The perpendicular coupling refers to exchange magnetic anisotropy in which a magnetization direction of a ferromagnetic material is fixed in a specific direction according to an antiferromagnetic spin direction due to a bonding of an antiferromagnetic material and the ferromagnetic material.

The tunneling barrier layer 500 is disposed on the first ferromagnetic layer 400. That is, the tunneling barrier layer 500 is interposed between the first ferromagnetic layer 400 and the second ferromagnetic layer 600 which will be described below.

A material of the tunneling barrier layer 500 may employ any insulating material. For example, the insulating material may be at least one selected from the group consisting of MgO, $Al_2O_3$, $HfO_2$, $TiO_2$, $Y_2O_3$, and $Yb_2O_3$. Preferably, the tunneling barrier layer 500 may be a MgO layer.

The tunneling barrier layer 500 may be formed by conventional deposition. For example, PVD, CVD, or sputtering is possible.

The second ferromagnetic layer 600 is disposed on the tunneling barrier layer 500. As described above, when the first ferromagnetic layer 400 is a fixed layer, the second ferromagnetic layer 600 may serve as a free layer.

Accordingly, the second ferromagnetic layer 600, which is a free layer, serves to store information by allowing a magnetization direction to be identical to or opposite to the magnetization direction of the first ferromagnetic layer 400, which is a fixed layer, according to a direction of an applied magnetic field.

In this case, the second ferromagnetic layer 600 is typically made of a ferromagnetic material having PMA. Accordingly, the second ferromagnetic layer 600 may include at least one selected from the group consisting of Fe, Co, Ni, B, Si, Zr, Pt, Tb, Pd, Cu, W, Ta, and a mixture thereof to have PMA.

For example, the second ferromagnetic layer 600 may contain CoFeB. In this case, the CoFeB layer may be set to a thin thickness to have PMA. For example, in order to have PMA, a thickness of the CoFeB layer may be set to 1.5 nm or less.

The second ferromagnetic layer 600 may be formed by conventional deposition. For example, PVD, CVD, or sputtering is possible.

Meanwhile, the second ferromagnetic layer 600 may already have PMA upon being formed, but it may also have PMA subsequent to being formed through heat treatment or the like.

Alternatively, a capping layer (not shown) disposed on the second ferromagnetic layer 600 may further be included. The capping layer serves as a protective layer and may prevent oxidation of the second ferromagnetic layer 600.

An MTJ element with PMA according to another embodiment of the present invention will be described.

Figure 2:
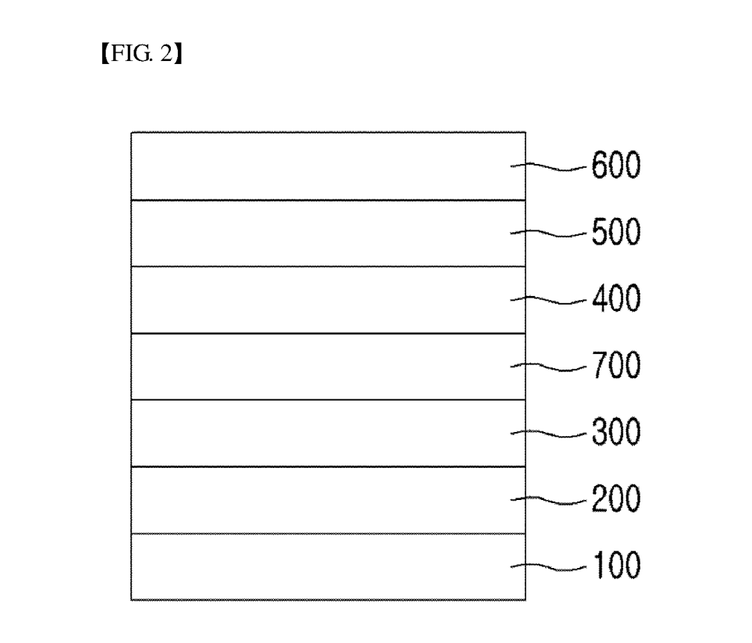
FIG. 2 is a cross-sectional view of an MTJ element with PMA according to another embodiment of the present invention.

FIG. 2 is a cross-sectional view of an MTJ element with PMA according to another embodiment of the present invention;

Referring to FIG. 2, the MTJ element with PMA according to another embodiment of the present invention may include a substrate 100, a perpendicular magnetic anisotropic inducing layer 200 disposed on the substrate 100 and containing an oxide-based material, a perpendicular antiferromagnetic layer 300 disposed on the perpendicular magnetic anisotropic inducing layer 200 and containing an antiferromagnetic material, a spacer layer 700 disposed on the perpendicular antiferromagnetic layer 300 and containing a non-magnetic metal layer, a first ferromagnetic layer 400 disposed on the spacer layer 700 and having PMA, a tunneling barrier layer 500 disposed on the first ferromagnetic layer 400, and a second ferromagnetic layer 600 disposed on the tunneling barrier layer 500 and having PMA.

Therefore, the perpendicular antiferromagnetic layer 300 generates perpendicular coupling at an interface with the perpendicular magnetic anisotropic inducing layer 200 so that perpendicular coupling is also generated between the perpendicular antiferromagnetic layer 300 and the first ferromagnetic layer 400.

A structure of FIG. 2 is identical to that of FIG. 1 except for further including the spacer layer 700, and thus an overlapping description thereof will be omitted and only the spacer layer 700 will be described below.

The spacer layer 700 is disposed between the perpendicular antiferromagnetic layer 300 and the first ferromagnetic layer 400 to serve in assisting exhibition of PMA of the first ferromagnetic layer 400.

The spacer layer 700 may include a non-magnetic metal. For example, the non-magnetic metal may include Ta, W, Hf, Mo, Nb, Al, Pd, Pt, Ti, Zr, V, or Cr.

The spacer layer 700 may be formed by conventional deposition. For example, PVD, CVD, or sputtering is possible.

An MTJ element with PMA according to still another embodiment of the present invention will be described.

Figure 3:
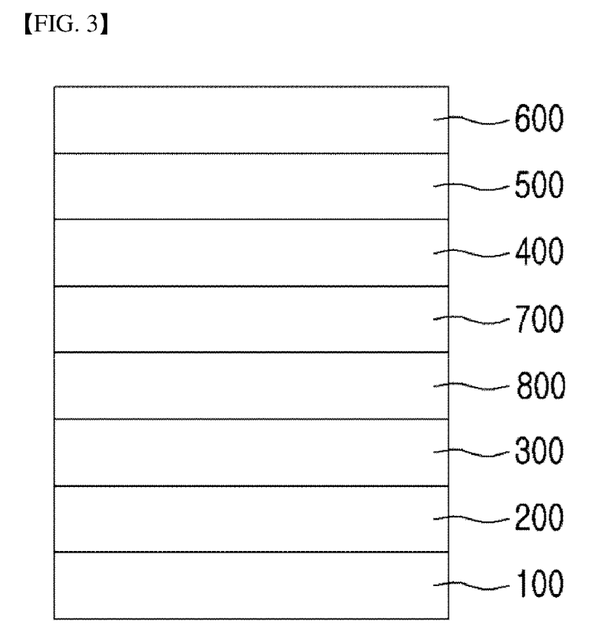
FIG. 3 is a cross-sectional view of an MTJ element with PMA according to still another embodiment of the present invention.

FIG. 3 is a cross-sectional view of an MTJ element with PMA according to still another embodiment of the present invention.

Referring to FIG. 3, the MTJ element with PMA according to still another embodiment of the present invention may include a substrate 100, a perpendicular magnetic anisotropic inducing layer 200 disposed on the substrate 100 and containing an oxide-based material, a perpendicular antiferromagnetic layer 300 disposed on the perpendicular magnetic anisotropic inducing layer 200 and containing an antiferromagnetic material, an adjacent ferromagnetic layer 800 disposed on the perpendicular antiferromagnetic layer 300 and containing a ferromagnetic material, a spacer layer 700 disposed on the adjacent ferromagnetic layer 800 and containing a non-magnetic metal layer, a first ferromagnetic layer 400 disposed on the spacer layer 700 and having PMA, a tunneling barrier layer 500 disposed on the first ferromagnetic layer 400, and a second ferromagnetic layer 600 disposed on the tunneling barrier layer 500 and having PMA.

Therefore, the perpendicular antiferromagnetic layer 300 generates perpendicular coupling at an interface with the perpendicular magnetic anisotropic inducing layer 200 so that perpendicular coupling is also generated between the perpendicular antiferromagnetic layer 300 and the first ferromagnetic layer 400.

A structure of FIG. 3 is identical to that of FIG. 2 except for further including the adjacent ferromagnetic layer 800, and thus an overlapping description thereof will be omitted and only the adjacent ferromagnetic layer 800 will be described below.

The perpendicular antiferromagnetic layer 300 may affect influence due to interaction on not only the first ferromagnetic layer 400 which is a fixed layer, but also the second ferromagnetic layer 600 which is a free layer. When the perpendicular antiferromagnetic layer 300 affects the influence on the second ferromagnetic layer 600, there is a problem in that hysteresis shift occurs. Accordingly, the adjacent ferromagnetic layer 800 is disposed between the perpendicular antiferromagnetic layer 300 and the spacer layer 700, thereby preventing the perpendicular antiferromagnetic layer 300 from affecting the second ferromagnetic layer 600 which is the free layer.

The adjacent ferromagnetic layer 800 may include a ferromagnetic material. For example, the ferromagnetic material may include Co, Fe, or Ni.

The adjacent ferromagnetic layer 800 may be formed by conventional deposition. For example, PVD, CVD, or sputtering is possible.

An MTJ element with PMA according to yet another embodiment of the present invention will be described.

Figure 4:
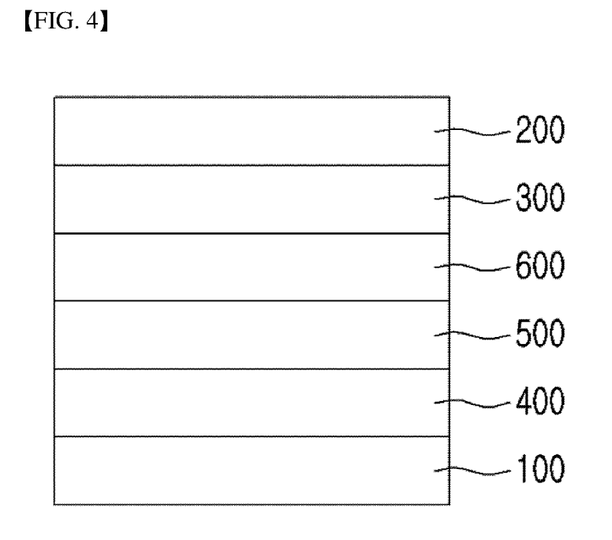
FIG. 4 is a cross-sectional view of an MTJ element with PMA according to yet another embodiment of the present invention.

FIG. 4 is a cross-sectional view of an MTJ element with PMA according to yet another embodiment of the present invention.

Referring to FIG. 4, the MTJ element with PMA according to yet another embodiment of the present invention may include a substrate 100, a first ferromagnetic layer 400, a tunneling barrier layer 500, a second ferromagnetic layer 600, a perpendicular antiferromagnetic layer 300, and a perpendicular magnetic anisotropic inducing layer 200.

The substrate 100 may employ a substrate made of various known materials. For example, the substrate 100 may be implemented with a silicon substrate. Alternatively, the substrate 100 may also be implemented with an electrode. In some cases, the substrate 100 may be omitted.

The first ferromagnetic layer 400 is disposed on the substrate 100. In this case, the first ferromagnetic layer 400 is typically made of a ferromagnetic material having PMA. For example, the first ferromagnetic layer 400 may include at least one selected from the group consisting of Fe, Co, Ni, B, Si, Zr, Pt, Tb, Pd, Cu, W, Ta, and a mixture thereof to have PMA. For example, the first ferromagnetic layer 400 may contain CoFeB. In this case, the first ferromagnetic layer 400 containing CoFeB may be formed with a thickness of 1.5 nm or less to have perpendicular magnetic anisotropy.

The first ferromagnetic layer 400 may be formed by conventional deposition. For example, PVD, CVD, or sputtering is possible.

Meanwhile, the first ferromagnetic layer 400 may already have PMA upon being formed, but it may also have PMA subsequent to being formed through heat treatment or the like.

Meanwhile, when the second ferromagnetic layer 600 is a fixed layer, the first ferromagnetic layer 400 may serve as a free layer.

Accordingly, the first ferromagnetic layer 400, which is a free layer, serves to store information by allowing a magnetization direction to be the same as or opposite to the magnetization direction of the second ferromagnetic layer 600, which is a fixed layer, according to a direction of an applied magnetic field.

The tunneling barrier layer 500 is disposed on the first ferromagnetic layer 400. That is, the tunneling barrier layer 500 is interposed between the first ferromagnetic layer 400 and the second ferromagnetic layer 600 which will be described below.

A material of the tunneling barrier layer 500 may employ any insulating material. For example, the insulating material may be at least one selected from the group consisting of $MgO$, $Al_2O_3$, $HfO_2$, $TiO_2$, $Y_2O_3$, and $Yb_2O_3$. Preferably, the tunneling barrier layer 500 may be a MgO layer.

The tunneling barrier layer 500 may be formed by conventional deposition. For example, PVD, CVD, or sputtering is possible.

The second ferromagnetic layer 600 is disposed on the tunneling barrier layer 500. In this case, the second ferromagnetic layer 600 is typically made of a ferromagnetic material having PMA. Accordingly, the second ferromagnetic layer 600 may include at least one selected from the group consisting of Fe, Co, Ni, B, Si, Zr, Pt, Tb, Pd, Cu, W, Ta, and a mixture thereof to have PMA.

For example, the second ferromagnetic layer 600 may contain CoFeB. In this case, the CoFeB layer may be set to a thin thickness to have perpendicular magnetic anisotropy. For example, in order to have PMA, a thickness of the CoFeB layer may be set to 1.5 nm or less.

The second ferromagnetic layer 600 may be formed by conventional deposition. For example, PVD, CVD, or sputtering is possible.

Meanwhile, the second ferromagnetic layer 600 may already have PMA upon being formed, but it may also have PMA subsequent to being formed through heat treatment or the like.

Further, a magnetization direction of the second ferromagnetic layer 600 is fixed by the perpendicular antiferromagnetic layer 300, which will be described below, to serve as a fixed layer.

Furthermore, the second ferromagnetic layer 600 may secure a sufficient coercive force by perpendicular coupling with the perpendicular antiferromagnetic layer 300 which will be described below.

The perpendicular antiferromagnetic layer 300 is disposed on the second ferromagnetic layer 600. The perpendicular antiferromagnetic layer 300 may include an antiferromagnetic material. For example, the antiferromagnetic material may include any one selected from the group consisting of Fe, Co, and Mn. However, the present invention is not limited thereto, and the antiferromagnetic material may employ any known ferrimagnetic substance or antiferromagnetic material.

The antiferromagnetic material by itself does not induce perpendicular coupling with the second ferromagnetic layer 600.

Accordingly, in the present invention, the perpendicular magnetic anisotropic inducing layer 200, which will be described below, is disposed on the perpendicular antiferromagnetic layer 300. Therefore, the perpendicular antiferromagnetic layer 300 generates perpendicular coupling at an interface with the perpendicular magnetic anisotropic inducing layer 200 so that perpendicular coupling is also generated between the perpendicular antiferromagnetic layer 300 and the second ferromagnetic layer 600.

The perpendicular antiferromagnetic layer 300 may be formed by conventional deposition. For example, PVD, CVD, or sputtering is possible.

The perpendicular magnetic anisotropic inducing layer 200 is disposed on the perpendicular antiferromagnetic layer 300. The perpendicular magnetic anisotropic inducing layer 200 may contain an oxide-based material. The oxide-based material is a metal oxide. For example, the metal oxide may include a cobalt oxide, a nickel oxide, or an iron oxide.

The perpendicular magnetic anisotropic inducing layer 200 generates perpendicular coupling at an interface with the perpendicular antiferromagnetic layer 300.

The perpendicular magnetic anisotropic inducing layer 200 may be formed by conventional deposition. For example, PVD, CVD, or sputtering is possible.

An MTJ element with PMA according to yet another embodiment of the present invention will be described.

Figure 5:
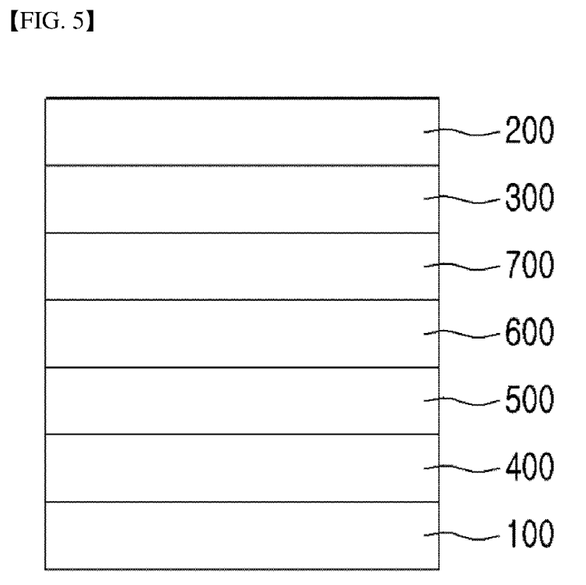
FIG. 5 is a cross-sectional view of an MTJ element with PMA according to yet another embodiment of the present invention.

FIG. 5 is a cross-sectional view of an MTJ element with PMA according to yet another embodiment of the present invention.

Referring to FIG. 5, the MTJ element with PMA according to yet another embodiment of the present invention may include a substrate 100, a first ferromagnetic layer 400 disposed on the substrate 100 and having PMA, a tunneling barrier layer 500 disposed on the first ferromagnetic layer 400, a second ferromagnetic layer 600 disposed on the tunneling barrier layer 500 and having PMA, a spacer layer 700 disposed on the second ferromagnetic layer 600 and including a non-magnetic metal, a perpendicular antiferromagnetic layer 300 disposed on the spacer layer 700 and including an antiferromagnetic material, and a perpendicular magnetic anisotropic inducing layer 200 disposed on the perpendicular antiferromagnetic layer 300 and including an oxide-based material.

Therefore, the perpendicular antiferromagnetic layer 300 generates perpendicular coupling at an interface with the perpendicular magnetic anisotropic inducing layer 200 so that perpendicular coupling is also generated between the perpendicular antiferromagnetic layer 300 and the second ferromagnetic layer 600.

A structure of FIG. 5 is identical to that of FIG. 4 except for further including the spacer layer 700, and thus an overlapping description thereof will be omitted and only the spacer layer 700 will be described below.

The spacer layer 700 is disposed between the second ferromagnetic layer 600 and the perpendicular antiferromagnetic layer 300 to serve in assisting exhibition of PMA of the second ferromagnetic layer 600.

The spacer layer 700 may include a non-magnetic metal. For example, the non-magnetic metal may include Ta, W, Hf, Mo, Nb, Al, Pd, Pt, Ti, Zr, V, or Cr.

The spacer layer 700 may be formed by conventional deposition. For example, PVD, CVD, or sputtering is possible.

An MTJ element with PMA according to yet another embodiment of the present invention will be described.

Figure 6:
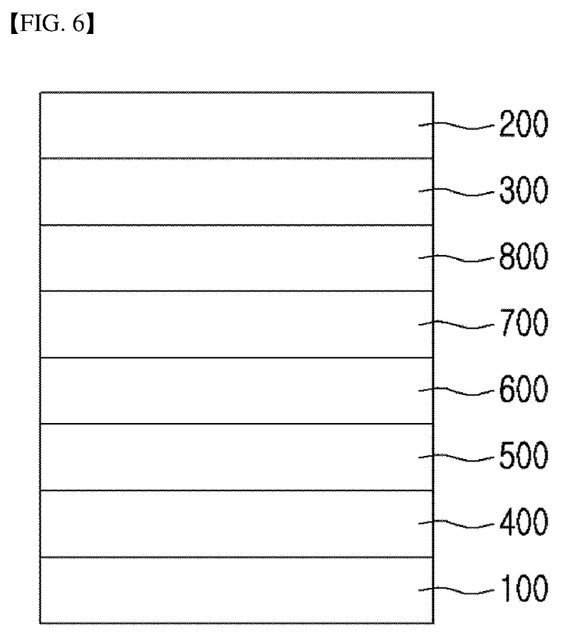
FIG. 6 is a cross-sectional view of an MTJ element with PMA according to yet another embodiment of the present invention.

FIG. 6 is a cross-sectional view of an MTJ element with PMA according to yet another embodiment of the present invention.

Referring to FIG. 6, the MTJ element with PMA according to yet another embodiment of the present invention may include a substrate 100, a first ferromagnetic layer 400 disposed on the substrate 100 and having PMA, a tunneling barrier layer 500 disposed on the first ferromagnetic layer 400, a second ferromagnetic layer 600 disposed on the tunneling barrier layer 500 and having a PMA, a spacer layer 700 disposed on the second ferromagnetic layer 600 and including a non-magnetic metal, an adjacent ferromagnetic layer 800 disposed on the spacer layer 700 and including a ferromagnetic material, a perpendicular antiferromagnetic layer 300 disposed on the adjacent ferromagnetic layer 800 and including an antiferromagnetic material, and a perpendicular magnetic anisotropic inducing layer 200 disposed on the perpendicular antiferromagnetic layer 300 and including an oxide-based material.

Therefore, the perpendicular antiferromagnetic layer 300 generates perpendicular coupling at an interface with the perpendicular magnetic anisotropic inducing layer 200 so that perpendicular coupling is also generated between the perpendicular antiferromagnetic layer 300 and the second ferromagnetic layer 600.

A structure of FIG. 6 is identical to that of FIG. 5 except for further including the adjacent ferromagnetic layer 800, and thus an overlapping description thereof will be omitted and only the adjacent ferromagnetic layer 800 will be described below.

The perpendicular antiferromagnetic layer 300 may affect influence due to interaction to not only the second ferromagnetic layer 600 which is a fixed layer, but also the first ferromagnetic layer 400 which is a free layer. When the perpendicular antiferromagnetic layer 300 affects the influence on the first ferromagnetic layer 400, there is a problem in that hysteresis shift occurs. Accordingly, the adjacent ferromagnetic layer 800 is disposed between the spacer layer 700 and the perpendicular antiferromagnetic layer 300, thereby preventing the perpendicular antiferromagnetic layer 300 from affecting the first ferromagnetic layer 400 which is the free layer.

The adjacent ferromagnetic layer 800 may include a ferromagnetic material. For example, the ferromagnetic material may include Co, Fe, or Ni.

The adjacent ferromagnetic layer 800 may be formed by conventional deposition. For example, PVD, CVD, or sputtering is possible.

A magnetic element including an MTJ structure with PMA according to one embodiment of the present invention will be described below.

The magnetic element may include a plurality of digit lines, a plurality of bit lines across the tops of the plurality of digit lines, and a magnetic tunnel junction interposed between the digit line and the bit line.

In this case, an MTJ may have the above-described structures of FIGS. 1 to 6. Accordingly, such an MTJ has been described above, and thus a detailed description thereof will be omitted.

Therefore, the MTJ will be used as a structure for storing information in an MRAM. Consequently, it is possible to provide a magnetic element including an MTJ structure which is structurally simplified, decreases an overall thickness of the magnetic element, and is stable during heat treatment.

In accordance with the present invention, perpendicular interaction is generated at a perpendicular antiferromagnetic layer-ferromagnetic layer junction such that an MTJ element is structurally simplified, lowers the overall thickness of the device, and is stable in the heat treatment process, thereby allowing a big leap for mass production of MTJ devices.

It should be noted that technical effects of the present invention are not limited to the above-described effects, and other technical effects of the present invention will be apparent to those skilled in the art from the appended claims.

While the example embodiments of the present invention and their advantages have been described in detail, it should be understood that various changes, substitutions and alterations may be made herein without departing from the scope of the invention.

The invention claimed is:

1. A magnetic tunnel junction (MTJ) structure with perpendicular magnetic anisotropy (PMA), the MTJ structure comprising:
   a substrate;
   a perpendicular magnetic anisotropic inducing layer disposed on the substrate and including an oxide-based material;
   a perpendicular antiferromagnetic layer disposed on the perpendicular magnetic anisotropic inducing layer and including an antiferromagnetic material;
   a first ferromagnetic layer disposed on the perpendicular antiferromagnetic layer and having PMA;
   a tunneling barrier layer disposed on the first ferromagnetic layer; and
   a second ferromagnetic layer disposed on the tunneling barrier layer and having PMA,
   wherein the perpendicular antiferromagnetic layer generates perpendicular coupling at an interface with the perpendicular magnetic anisotropic inducing layer such that perpendicular coupling is further generated between the perpendicular antiferromagnetic layer and the first ferromagnetic layer.

2. The MTJ structure of claim 1, wherein the oxide-based material includes a metal oxide.

3. The MTJ structure of claim 2, wherein the metal oxide includes a cobalt oxide, a nickel oxide, or an iron oxide.

4. The MTJ structure of claim 1, wherein the antiferromagnetic material is an alloy including any one selected from the group consisting of Fe, Co, and Mn.

5. The MTJ structure of claim 1, wherein the first ferromagnetic layer includes at least one selected from the group consisting of Fe, Co, Ni, B, Si, Zr, Pt, Tb, Pd, Cu, W, Ta, and a mixture thereof.

6. The MTJ structure of claim 1, wherein the first ferromagnetic layer secures a coercive force by perpendicular coupling with the perpendicular antiferromagnetic layer.

7. The MTJ structure of claim 1, further comprising a spacer layer disposed between the perpendicular antiferromagnetic layer and the first ferromagnetic layer and including a non-magnetic metal.

8. The MTJ structure of claim 7, further comprising an adjacent ferromagnetic layer disposed between the perpendicular antiferromagnetic layer and the spacer layer and including a ferromagnetic material.

9. A magnetic tunnel junction (MTJ) structure with perpendicular magnetic anisotropy (PMA), the MTJ structure comprising:
   a substrate;
   a first ferromagnetic layer disposed on the substrate and having PMA;
   a tunneling barrier layer disposed on the first ferromagnetic layer;
   a second ferromagnetic layer disposed on the tunneling barrier layer and having PMA;
   a perpendicular antiferromagnetic layer disposed on the second ferromagnetic layer and including an antiferromagnetic material; and
   a perpendicular magnetic anisotropic inducing layer disposed on the perpendicular antiferromagnetic layer and including an oxide-based material,
   wherein the perpendicular antiferromagnetic layer generates perpendicular coupling at an interface with the perpendicular magnetic anisotropic inducing layer such that perpendicular coupling is further generated between the perpendicular antiferromagnetic layer and the second ferromagnetic layer.

10. The MTJ structure of claim 9, wherein the antiferromagnetic material is an alloy including any one selected from the group consisting of Fe, Co, and Mn.

11. The MTJ structure of claim 9, wherein the second ferromagnetic layer includes at least one selected from the group consisting of Fe, Co, Ni, B, Si, Zr, Pt, Tb, Pd, Cu, W, Ta, and a mixture thereof.

12. The MTJ structure of claim 9, wherein the second ferromagnetic layer secures a coercive force by perpendicular coupling with the perpendicular antiferromagnetic layer.

13. The MTJ structure of claim 9, further comprising a spacer layer disposed between the second ferromagnetic layer and the perpendicular antiferromagnetic layer and including a non-magnetic metal.

14. The MTJ structure of claim 13, further comprising an adjacent ferromagnetic layer disposed between the spacer layer and the perpendicular antiferromagnetic layer and including a ferromagnetic material.

15. A magnetic element comprising:
   a plurality of digit lines;
   a plurality of bit lines across the tops of the plurality of digit lines; and
   the MTJ structure according to claim 1, which is interposed between the digit line and the bit line.

* * * * *